(12) United States Patent
Yang et al.

(10) Patent No.: US 12,278,118 B2
(45) Date of Patent: Apr. 15, 2025

(54) SUBSTRATE PROCESSING APPARATUS AND SUBSTRATE PROCESSING METHOD INCLUDING PROCESSING LIQUID SUPPLY UNIT

(71) Applicant: SEMES CO., LTD., Cheonan-si (KR)

(72) Inventors: Seung Tae Yang, Yongin-si (KR); Jong Han Kim, Sejong-si (KR); Do Gyeong Ha, Daegu (KR)

(73) Assignee: SEMES CO., LTD., Cheonan-si (KR)

( * ) Notice: Subject to any disclaimer, the term of this patent is extended or adjusted under 35 U.S.C. 154(b) by 588 days.

(21) Appl. No.: 17/520,588

(22) Filed: Nov. 5, 2021

(65) Prior Publication Data

US 2022/0181169 A1 Jun. 9, 2022

(30) Foreign Application Priority Data

Dec. 9, 2020 (KR) .......................... 10-2020-0171186

(51) Int. Cl.
*H01L 21/67* (2006.01)
*H01L 21/02* (2006.01)

(52) U.S. Cl.
CPC .. *H01L 21/67023* (2013.01); *H01L 21/02041* (2013.01)

(58) Field of Classification Search
CPC ......... H01L 21/67023; H01L 21/67051; H01L 21/6708; H01L 21/67028; H01L 21/02052; H01L 21/67109; H01L 21/02057
USPC .......................... 134/902, 153, 94.1, 26, 95.1
See application file for complete search history.

(56) References Cited

U.S. PATENT DOCUMENTS

| | | | |
|---|---|---|---|
| 8,282,771 B2 | 10/2012 | Song et al. | |
| 9,406,501 B2* | 8/2016 | Lee | H01L 21/67051 |
| 10,424,496 B2 | 9/2019 | Inoue et al. | |
| 10,720,333 B2* | 7/2020 | Fujiwara | H01L 21/0209 |
| 2002/0172764 A1* | 11/2002 | Caldwell | H01L 21/68757 |
| | | | 118/728 |
| 2004/0234696 A1* | 11/2004 | Hongo | H01L 21/76874 |
| | | | 427/430.1 |
| 2010/0313915 A1* | 12/2010 | Fujiwara | H01L 21/67051 |
| | | | 134/102.1 |
| 2012/0175819 A1* | 7/2012 | Miya | H01L 21/02052 |
| | | | 425/445 |
| 2015/0270145 A1* | 9/2015 | Inoue | H01L 21/6708 |
| | | | 156/345.18 |

FOREIGN PATENT DOCUMENTS

| | | |
|---|---|---|
| JP | 2012-33961 | 2/2012 |
| JP | 2013-251548 | 12/2013 |
| JP | 2015-185644 | 10/2015 |

(Continued)

OTHER PUBLICATIONS

Office Action from the Japan Patent Office dated Sep. 6, 2022.

(Continued)

*Primary Examiner* — Charles P. Cheyney

(57) ABSTRACT

A substrate processing apparatus a processing liquid supply unit includes a nozzle supplying a processing liquid onto the substrate, a supply line connected to the nozzle to supply the processing liquid to the nozzle, and a cooler cooling the processing liquid. A volume of the processing liquid is reduced by the cooler so that the processing liquid may be sucked.

5 Claims, 8 Drawing Sheets

(56) References Cited

FOREIGN PATENT DOCUMENTS

| KR | 10-2009-0029958 | 3/2009 |
| KR | 10-2013-0134987 | 12/2013 |
| KR | 10-2015-0110273 | 10/2015 |
| TW | 201543174 | 11/2015 |
| TW | 201814766 | 4/2018 |
| WO | 2010-035396 | 4/2010 |

OTHER PUBLICATIONS

Office Action from the Taiwan Intellectual Property Office dated Jul. 12, 2022.
Office Action from Korean Intellectual Property Office dated Feb. 15, 2023.

\* cited by examiner

SUBSTRATE PROCESSING APPARATUS AND SUBSTRATE PROCESSING METHOD INCLUDING PROCESSING LIQUID SUPPLY UNIT

CROSS REFERENCE TO RELATED APPLICATION

The present application claims priority to Korean Patent Application No. 10-2020-0171186, filed Dec. 9, 2020, the entire contents of which is incorporated herein for all purposes by this reference.

BACKGROUND OF THE INVENTION

Field of the Invention

The present disclosure relates to a substrate processing apparatus including a processing liquid supply unit, a substrate processing system including the substrate processing apparatus, and a substrate processing method using the substrate processing system.

Description of the Related Art

In general, in a semiconductor device manufacturing process, various unit processes such as a thin film deposition process, etching process, cleaning process, and photo process performed on a substrate such as a wafer are repeatedly performed. Among the above processes, a processing liquid supply unit for supplying a processing liquid to the substrate is provided in some processes such as a wet cleaning process, a wet etching process, and a coating process.

The processing liquid supply unit provides a processing liquid suitable for each of the processing processes to the substrate while controlling concentration and temperature of the processing liquid. A substrate processing apparatus including the processing liquid supply unit may include a nozzle. The nozzle sprays the processing liquid on a substrate seated on a spin head. The nozzle is connected to a storage tank storing the processing liquid via a supply line. The supply line is supplied with the processing liquid from the storage tank and supplies the processing liquid to the nozzle. The supply line may have an adjustment valve and a suck-back valve. The adjustment valve adjusts the amount of processing liquid supplied to the nozzle and the suck-back valve sucks back and removes processing liquid remaining in the nozzle. When the adjustment valve is turned off and the processing liquid supplied to the nozzle is blocked, the suck-back valve sucks back the processing liquid remaining in the nozzle and thus prevents the processing liquid remaining in the nozzle from leaking to the outside of the substrate processing apparatus.

However, recently, as a diameter of a nozzle outlet is increased to increase the amount of processing liquid discharged, dropping of processing liquid is significantly increased. In addition, since processing liquid of surfactants or processing liquid with low viscosity (e.g., liquid organic solvents (IPA), solutions containing ozone, etc.) has low surface tension, even when the processing liquid is sucked back, the processing liquid in the supply line flows into the nozzle by gravity, so that leakage of the processing liquid to the outside easily occurs. Particularly, when an external impact is applied, dropping of the processing liquid remaining a portion close to the nozzle outlet on a flow path of the nozzle occurs intermittently.

Therefore, more processing liquid than necessary will contaminate and damage the substrate, and when the contamination and damage to the substrate are repeated, it becomes difficult to produce the substrate with the desired quality. In addition, when cleaning of the substrate is performed using a plurality of nozzles, an unwanted heterogeneous processing liquid is dropped to cause contamination of the substrate or the spin head, so that the efficiency of the cleaning may be deteriorated. The dropping of the processing liquid causes a problem of poor productivity of the substrate. Furthermore, inefficiently sucking-back of the processing liquid may cause problems such as Taylor cone, air layer formation at an end of the nozzle, etc.

DOCUMENTS OF RELATED ART (Patent Document 1) Korean Patent Application Publication No. 10-2010-0066499 (2010 Jun. 17)

SUMMARY OF THE INVENTION

Accordingly, the present disclosure has been made keeping in mind the above problems occurring in the related art, and the present disclosure is intended to provide a substrate processing apparatus and substrate processing method including a processing liquid supply unit, which are capable of efficiently sucking back a processing liquid with a low surface tension.

Another objective of the present disclosure is provide a substrate processing apparatus and substrate processing method including a processing liquid supply unit, which are capable of preventing dropping of a processing liquid regardless of a type of the processing liquid.

The problem to be solved is not limited thereto, and other problems not mentioned will be clearly understood by those skilled in the art from the following description.

In order to achieve the above objective, according to one aspect of the present disclosure, there is provided a substrate processing apparatus including: a substrate support unit configured to support a substrate; and a processing liquid supply unit configured to supply a processing liquid to the substrate, wherein the processing liquid supply unit may include: a nozzle configured to supply the processing liquid onto the substrate; a supply line connected to the nozzle to supply the processing liquid to the nozzle; and a cooler cooling the processing liquid.

The cooler may be configured to supply coolant to an outside of the supply line.

The cooler may include a tubular member provided for surrounding the supply line.

The tubular member may have an inside space, and the cooler may supply the coolant to the inside space of the tubular member.

The cooler may reduce volume of the processing liquid.

The cooler may be configured to control at least one of a temperature, a supply flow volume, a supply time, and a heat transfer area of the coolant supplied to the inside space of the tubular member in response to a type of the processing liquid.

The nozzle may be connected to a supply part for inert gas such as nitrogen, and discharge the inert gas onto the substrate.

According to one aspect of the present disclosure, there is provided a substrate processing system including: a load port on which a carrier storing a substrate is seated; an index chamber having an index robot therein, the index robot being configured to carry the substrate from the carrier seated on the load port; and a liquid processing apparatus performing a liquid processing process on the substrate, wherein the liquid processing apparatus may include: a substrate support unit configured to support the substrate; and a processing liquid supply unit configured to supply a processing liquid to the substrate, wherein the processing liquid supply unit may include: a nozzle configured to supply the processing liquid onto the substrate; a supply line connected to the nozzle to supply the processing liquid to the nozzle; and a cooler including a tubular member surrounding the supply line supplying the processing liquid to the nozzle.

The cooler may be configured to supply coolant to an outside of the supply line.

The tubular member may have an inside space, and the cooler may supply the coolant to the inside space of the tubular member.

The cooler may reduce volume of the processing liquid.

The cooler may be configured to control at least one of a temperature, supply flow rate, supply time, and heat transfer area of the coolant supplied to the inside space of the tubular member in response to a type of the processing liquid.

The nozzle may be connected to a supply part for inert gas such as nitrogen, and discharges the inert gas toward the substrate.

According to one aspect of the present disclosure, there is provided a substrate processing method using a substrate processing apparatus, the apparatus including a nozzle configured to discharge a processing liquid or inert gas onto a substrate and a supply line provided for supplying the processing liquid to the nozzle, the substrate processing method including: discharging the processing liquid onto the substrate; sucking the processing liquid remaining in the nozzle during a time when the supplying of the processing liquid is stopped; and supplying the inert gas onto the substrate. Each of the sucking of the processing liquid and the supplying of the inert gas may include cooling the processing liquid.

A volume of the processing liquid may be reduced by passing through the cooling the processing liquid.

The cooling the processing liquid may include supplying coolant to an outside of the supply line.

A flow rate of the coolant supplied in the sucking of the processing liquid and a flow rate of the coolant supplied in the supplying the inert gas may be different from each other.

The cooling the processing liquid in the supplying of the inert gas prevents the processing liquid from dropping from the nozzle.

In the cooling of the processing liquid, at least one of a temperature, a flow rate, a supply time, a heat transfer area of the coolant may be controlled.

The coolant is controlled such that a volume of the processing liquid sucked or a time for which the processing liquid is being sucked may be controlled.

According to the embodiment of the present disclosure, the coolant is supplied to the outside of the processing liquid supply line to reduce the volume of the processing liquid, whereby the sucking back of the processing liquid can be achieved. Therefore, dropping of the processing liquid, Taylor cone, and air layer formation at an end of the nozzle can be prevented.

According to the embodiment of the present disclosure, the conditions of the coolant, such as a supply flow rate, temperature of the coolant, are controlled to continuously apply a force in a direction opposite to a discharge direction of the processing liquid, whereby after discharge completion of the process liquid or even while waiting for the nozzle to be driven, the dropping of the processing liquid can be prevented. In other words, the sucked-back volume of the processing liquid or the sucked-back time thereof can be adjusted by controlling the conditions of the coolant.

Effects of the present disclosure are not limited thereto, and other effects not mentioned will be clearly understood by those skilled in the art from this specification and the accompanying drawings.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
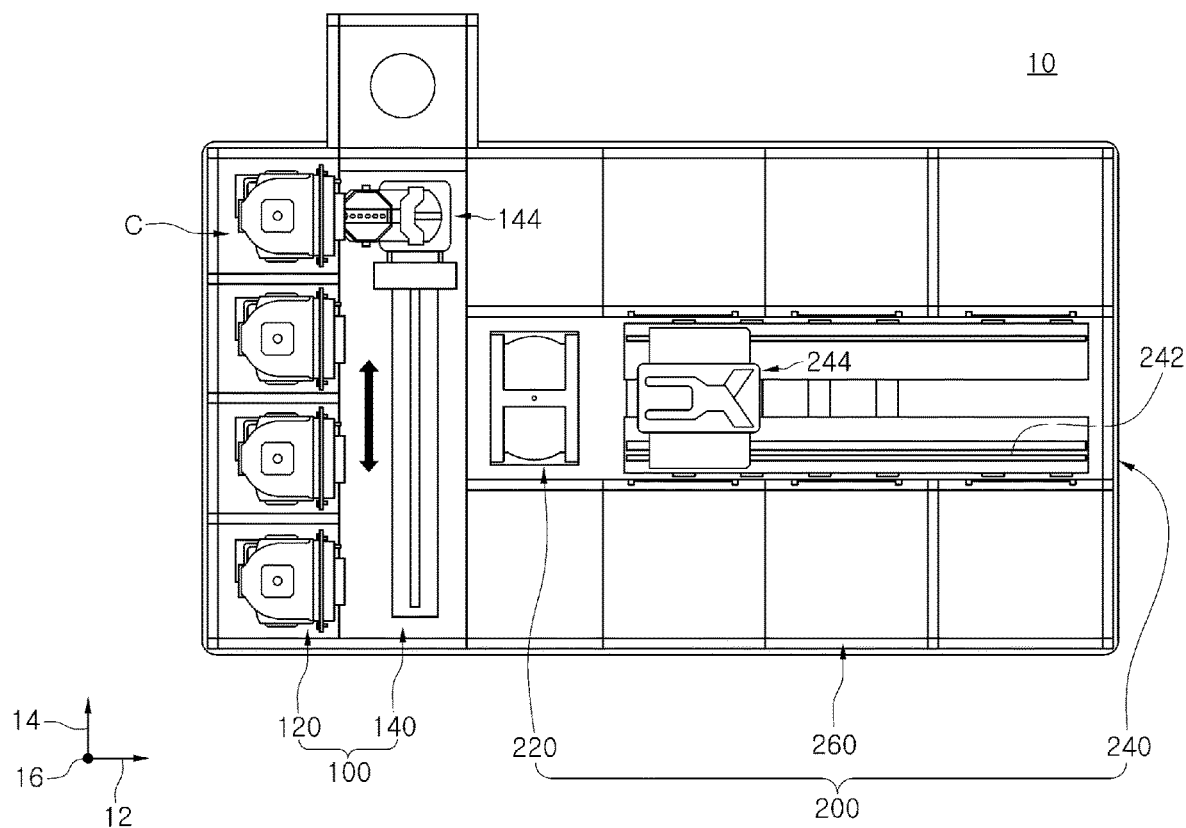
FIG. 1 is a view showing an example of a substrate processing system according to an embodiment of the present disclosure.

Hereinbelow, exemplary embodiments of the present disclosure will be described in detail with reference to the accompanying drawings such that the present disclosure can be easily embodied by one of ordinary skill in the art to which the present disclosure belongs. However, the present disclosure may be changed to various embodiments and the scope and spirit of the present disclosure are not limited to the embodiments described hereinbelow.

In the following description, if it is decided that the detailed description of known function or configuration related to the present disclosure makes the subject matter of the present disclosure unclear, the detailed description is omitted, and the same reference numerals will be used throughout the drawings to refer to the elements or parts with same or similar function or operation.

Further, technical teams, as will be mentioned hereinafter, are terms defined in consideration of their function in the present disclosure, which may be changed according to the intention of a user, practice, or the like. Therefore, the terms should be defined based on the contents of this specification Unless the context clearly indicates otherwise, it will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion such as "between" versus "directly between", "adjacent" versus "directly adjacent", etc.

In the drawings, the shapes and sizes of parts and thicknesses of lines may be exaggerated for convenience of understanding.

Embodiments of the present disclosure will be described with reference to schematic figures in exemplary embodiments of the present disclosure. Accordingly, changes from the figures in the drawings, for example, changes in manufacturing methods and tolerances, are sufficiently predictable. Therefore, the embodiments of the present disclosure are not described as being limited to the specific figures of areas as shown in the drawings, but rather to include deviations in the figures. The elements shown in the drawings are entirely schematic and the figures thereof in the drawings are not intended to describe the exact figures thereof, and are not intended to limit the scope of the present disclosure.

According to an embodiment of the present disclosure, a substrate processing apparatus may be used to perform a liquid processing process with respect to a substrate such as semiconductor wafers or flat display panels. As an example, a substrate processing system of the embodiment will be used to a cleaning process with respect to the substrate. Hereinbelow, the substrate processing apparatus and a liquid processing apparatus are considered to be the same.

FIG. 1 is a view showing an example of the substrate processing system according to an embodiment of the present disclosure. Referring to FIG. 1, the substrate processing system 10 includes an index part 100 and a processing part 200.

The index part 100 may include a load port 120 and an index chamber 140. The load port 120, the index chamber 140, and the processing part 200 may be sequentially arranged in a line. Hereinbelow, a direction in which the load port 120, the index chamber 140, and the processing part 200 are arranged is referred to a first direction 12. In a view from the top, a direction perpendicular to the first direction 12 is referred to a second direction 14. A direction perpendicular to a plane including the first direction 12 and the second direction 14 is referred to a third direction 16.

A carrier C storing the substrate W may be seated on the load port 120. The load port 120 may be a plurality of load ports 120, and the plurality of load ports 120 may be arranged in a line along the second direction 14. FIG. 1 is a view in which four load ports 120 are provided. However, the number of the load ports 120 may be increased or reduced in response to conditions such as process efficiency of the processing part 200 and footprint (or process efficiency and footprint of the processing part 200). A front opening unified pod (FOUP) may be used as the carrier C.

The index chamber 140 may be located between the load port 120 and the processing part 200. The index chamber 140 has a cuboid form including a front panel, rear panel, and opposite lateral panels. An index robot 144 may be provided in the index chamber 140, the index robot 144 being provided to carry the substrate W between the carrier C seated on the load port 120 and a load-lock chamber 220. Although not shown in the drawings, the index chamber 140 may include a controlled air flow system such as vents, laminar flow systems in order to prevent particles from flowing into the inside of the index chamber 140.

The processing part 200 may include the load-lock chamber 220, a transfer chamber 240, and liquid processing chambers 260. The transfer chamber 240 may be arranged such that a longitudinal direction thereof is parallel to the first direction 12. Along the second direction 14, the liquid processing chambers 260 may be arranged on first and second lateral portions of the transfer chamber 240.

Some of the liquid processing chambers 260 may be arranged along the longitudinal direction of the transfer chamber 240. Furthermore, some of the liquid processing chambers 260 may be arranged to be layered to each other.

On the first lateral portion of the transfer chamber 240, some of the liquid processing chambers 260 may be arranged in an arrangement of A×B (each of A and B is a natural number greater than or equal to 1). A is the number of the liquid processing chambers 260 provided in a line along the first direction 12. B is the number of the liquid processing chambers 260 provided in a line along the third direction 16.

The load-lock chamber 220 is arranged between the index chamber 140 and the transfer chamber 240. The load-lock chamber 220 provides a space to temporarily load the substrate W before the substrate W is carried between the transfer chamber 240 and the index chamber 140. The load-lock chamber 220 has a slot (not shown) in which the substrate W is placed. The slot (not shown) may be a plurality of slots spaced apart from each other along the third direction 16. The load-lock chamber 220 is provided such that a surface thereof facing the index chamber 140 and a surface thereof facing the transfer chamber 240 have opening forms.

The transfer chamber 240 may carry the substrate W between the load-lock chamber 220 and the liquid processing chambers 260. The transfer chamber 240 may have a guide rail 242 and a main robot 244. The guide rail 242 may be arranged such that a longitudinal direction thereof is parallel to the first direction 12. The main robot 244 is provided on the guide rail 242 and is moved rectilinearly in the first direction 12 on the guide rail 242.

Hereinbelow, configurations carrying the substrate W are defined as a transfer unit. As an example, the transfer unit may include the transfer chamber 240 and the index chamber 140. Furthermore, the transfer unit may include the main robot 244 and the index robot 144 included in the transfer chamber 240.

The substrate processing apparatus may be provided in the liquid processing chambers 260. The substrate processing apparatus may perform the liquid processing process with respect to the substrate W, e.g., the cleaning process. For example, the cleaning process may be a process of cleaning the substrate W, and removing a strip and organic residue by using a processing fluid containing alcohol. The substrate processing apparatus provided in each of the liquid processing chambers 260 may have a different structure for each type of the cleaning process to be performed. Selectively, the substrate processing apparatus in each of the liquid processing chambers 260 may have the same structure. Selectively, the liquid processing chambers 260 may be divided into a plurality of groups. Substrate processing apparatuses provided in some of the liquid processing chambers 260 belonging to the same group may have the same structure, and substrate processing apparatuses provided in some of the liquid processing chambers 260 belonging to different groups may have different structures. Hereinbelow, an example of the liquid processing apparatus provided in the liquid processing chambers 260 will be described.

Figure 2:
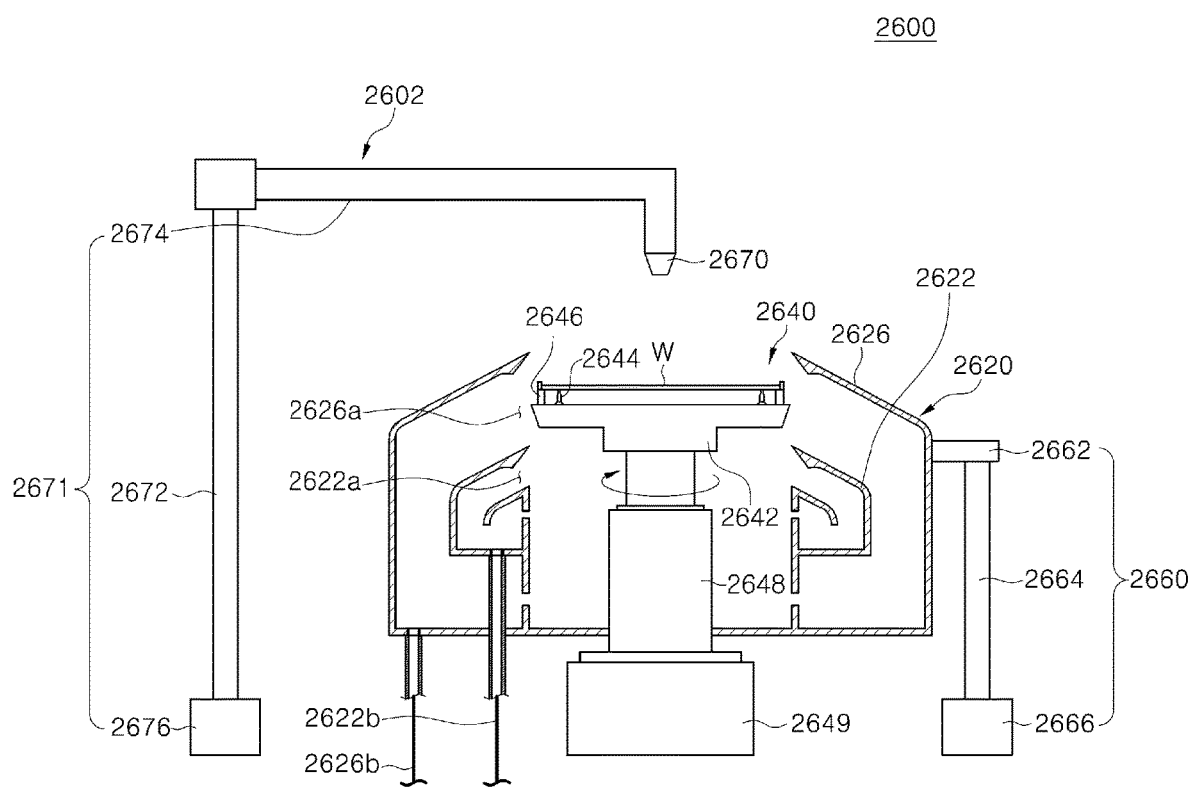
FIG. 2 is a view showing an example of a substrate processing apparatus according to the embodiment of the present disclosure.

FIG. 2 is a view showing an example of a liquid processing apparatus according to the embodiment of the present disclosure. FIG. 2 is a view showing the liquid processing apparatus provided in each of the liquid processing chambers 260, the liquid processing apparatus being provided to process the substrate according to the present disclosure. Referring to FIG. 2, the liquid processing apparatus 2600 provided in each of the liquid processing chamber includes a processing container 2620, a substrate support unit 2640, a raising and lowering unit 2660, and the processing liquid supply unit 2602. The liquid processing apparatus 2600 provided in each of the liquid processing chambers 260 may supply the processing liquid to the substrate W. For example, the processing liquid may be a developer, an etchant, a cleaning solution, a rinse solution, and an organic solvent. Etchant or cleaning solution may be a liquid with basic properties and may include sulfuric acid (H2SO4), phosphoric acid (P2O5), hydrofluoric acid (HF), and ammonium hydroxide (NH4OH). The rinse solution may be de-ionized water (DIW). The organic solvent may be isopropyl alcohol (IPA), i.e., a low surface tension fluid. The processing liquid may be diluted sulfuric acid peroxide (DSP).

The processing container 2620 may provide a space in which the substrate is processed. The processing container 2620 has a barrel shape with an open upper portion. The processing container 2620 may include the outer recovery container 2626 (or first recovery container) and an inner recovery container 2622 (or second recovery container). The recovery containers 2622 and 2626 respectively recover different processing liquids among the processing liquids used in the process. The inner recovery container 2622 is formed in a ring shape surrounding the substrate support unit 2640. The outer recovery container 2626 may be formed in a ring shape surrounding the inner recovery container 2622. An inside space 2622a of the inner recovery container 2622 serves as an inner inlet 2622a through which the processing liquid flows into the inner recovery container 2622. An interspace 2626a located between the inner recovery container 2622 and the outer recovery container 2626 serves as an outer inlet 2626a through which the processing liquid flows into the outer recovery container 2626. Each of the inlets 2622a and 2626a may be located at different height from each other. Recovery lines 2622b and 2626b are respectively connected to lower surfaces of the recovery containers 2622 and 2626. The processing liquid introduced into each of the recovery containers 2622 and 2626 may be reused by being provided into an external processing liquid treatment (regeneration) system through the recovery lines 2622b and 2626b.

The substrate support unit 2640 supports the substrate W in the processing space. The substrate support unit 2640 may support and rotate the substrate W during the process. The substrate support unit 2640 may have a support plate 2642, a support pin 2644, a chuck pin 2646, and a rotation driving member. The support plate 2642 may be formed in a generally circular plate shape.

A plurality of support pins 2644 is projected upward from the support plate 2642 to support the substrate W.

A plurality of chuck pins 2646 is projected upward from the support plate 2642 to support lateral portions of the substrate W. The chuck pins 2646 support the lateral portions of the substrate W so as to prevent the substrate W from deviating radially from an original location when the support plate 2642 is rotated. The chuck pins 2646 are provided to be rectilinearly movable between outer locations and inner locations in a radial direction of the support plate 2642. When the substrate W is loaded or unloaded on the support plate 2642, the chuck pins 2646 are located at the outer locations. When the process with respect to the substrate W is performed, the chuck pins 2646 are located at the inner locations. The inner locations are locations where the chuck pins 2646 and the lateral portions of the substrate W are contact each other. The outer locations are locations where the chuck pins 2646 and the substrate W are separated from each other.

The rotation driving member 2648 and 2649 rotates the support plate 2642. The support plate 2642 is rotatable on a central shaft thereof by the rotation driving member 2648 and 2649. The rotation driving member 2648 and 2649 includes a support shaft 2648 and a driving part 2649. The support shaft 2648 may have a barrel shape formed in the third direction 16. An upper end of the support shaft 2648 may be securely coupled to a lower surface of the support plate 2642. The driving part 2649 provides a driving force so that the support shaft 2648 is rotated. The support shaft 2648 is rotated by the driving part 2649 and the support plate 2642 may be rotated together with the support shaft 2648.

The raising and lowering unit 2660 vertically moves the processing container 2620 in a vertical direction. As the processing container 2620 is vertically moved, a relative height of the processing container 2620 to the support plate 2642 is changed. When the substrate W is loaded or unloaded on the support plate 2642, the raising and lowering unit 2660 is operated such that the processing container 2620 is lowered so as to project the support plate 2642 upward from the upper portion of the processing container 2620.

Furthermore, during the process, depending on a type of the processing liquid supplied to the substrate W, the height of the processing container 2620 is adjusted, so that the processing liquid flows into the preset recovery containers 2622 and 2626. The raising and lowering unit 2660 may include a bracket 2662, a moving shaft 2664, and a driving unit 2666. The bracket 2662 is securely provided on an outer wall of the processing container 2620. The moving shaft 2664 may be securely coupled to the bracket 2662 and vertically moved by the driving unit 2666. The raising and lowering unit 2660 may selectively move the support plate 2642 in the vertical direction.

The processing liquid supply unit 2602 supplies the processing liquid to the substrate W. A plurality of processing liquid supply units 2602 may be provided. The processing liquid supply units 2602 may supply respectively different types of processing liquids.

The processing liquid supply unit 2602 may include a moving member 2671 and a nozzle 2670.

The moving member 2671 may move the nozzle 2670 to a process location and a waiting location. The process location is a location where the nozzle 2670 faces an upper surface of the substrate W supported on the substrate support unit 2640. The waiting location is a location where the nozzle 2670 is out of the process location.

The moving member 2671 may include a supporting shaft 2672, an arm 2674, and a driving device 2676. The supporting shaft 2672 is located at one side of the processing container 2620. The supporting shaft 2672 may have a rod shape extending in the third direction 16. The supporting shaft 2672 is provided to be rotatable by the driving device 2676. The supporting shaft 2672 may be provided to be movable in the vertical direction. The arm 2674 is coupled to an upper end of the supporting shaft 2672 and may perpendicularly extend from the supporting shaft 2672. The nozzle 2670 is securely coupled to an end of the arm 2674. As the supporting shaft 2672 is rotated, the nozzle 2670 may be swung with the arm 2674. The nozzle 2670 is swung to be moved to the process location and the waiting location. The arm 2674 may be provided to be selectively movable forward and rearward in a longitudinal direction thereof. In a view from the top, a route in which the nozzle 2670 may coincide with a central shaft of the substrate W at the process location.

Figure 3:
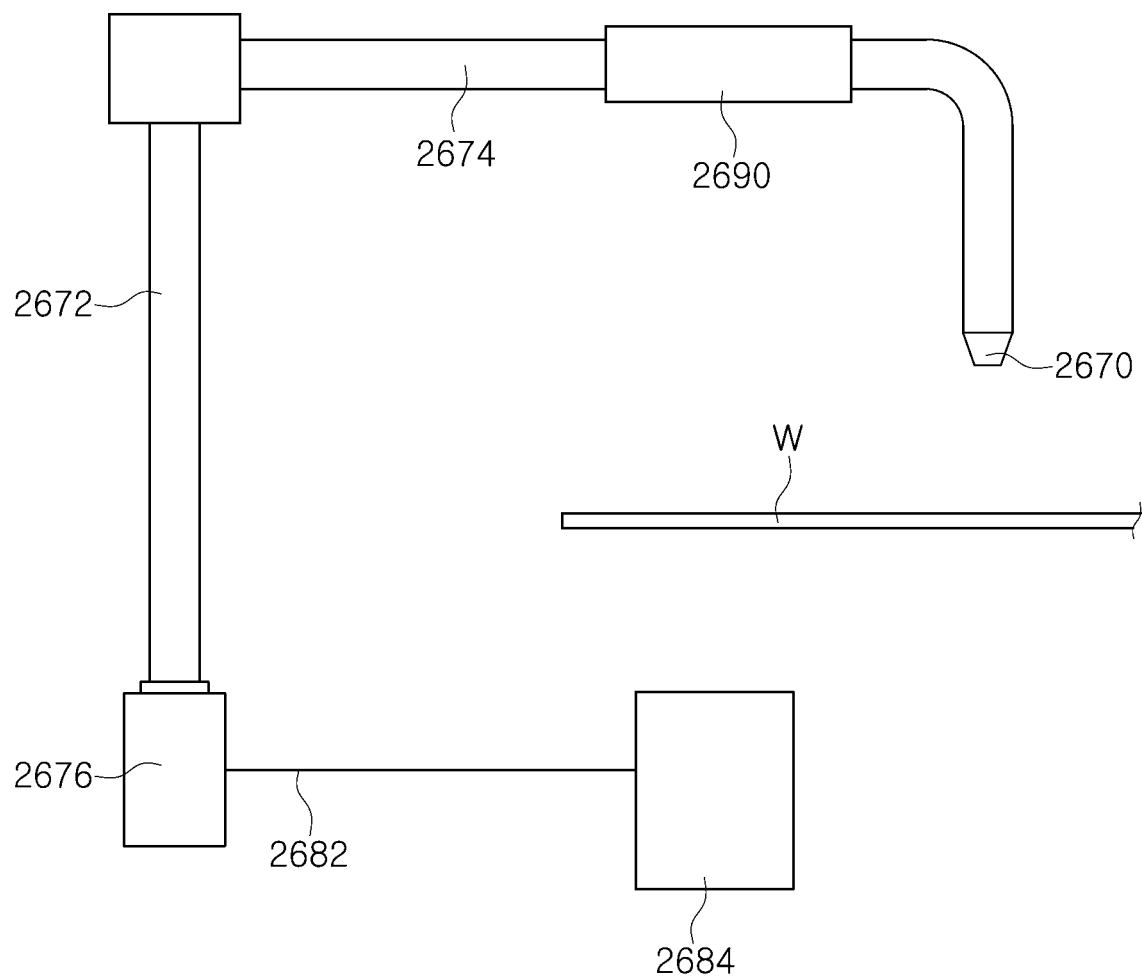
FIG. 3 is an enlarged view schematically showing a processing liquid supply unit shown in FIG. 2.
Figure 4:
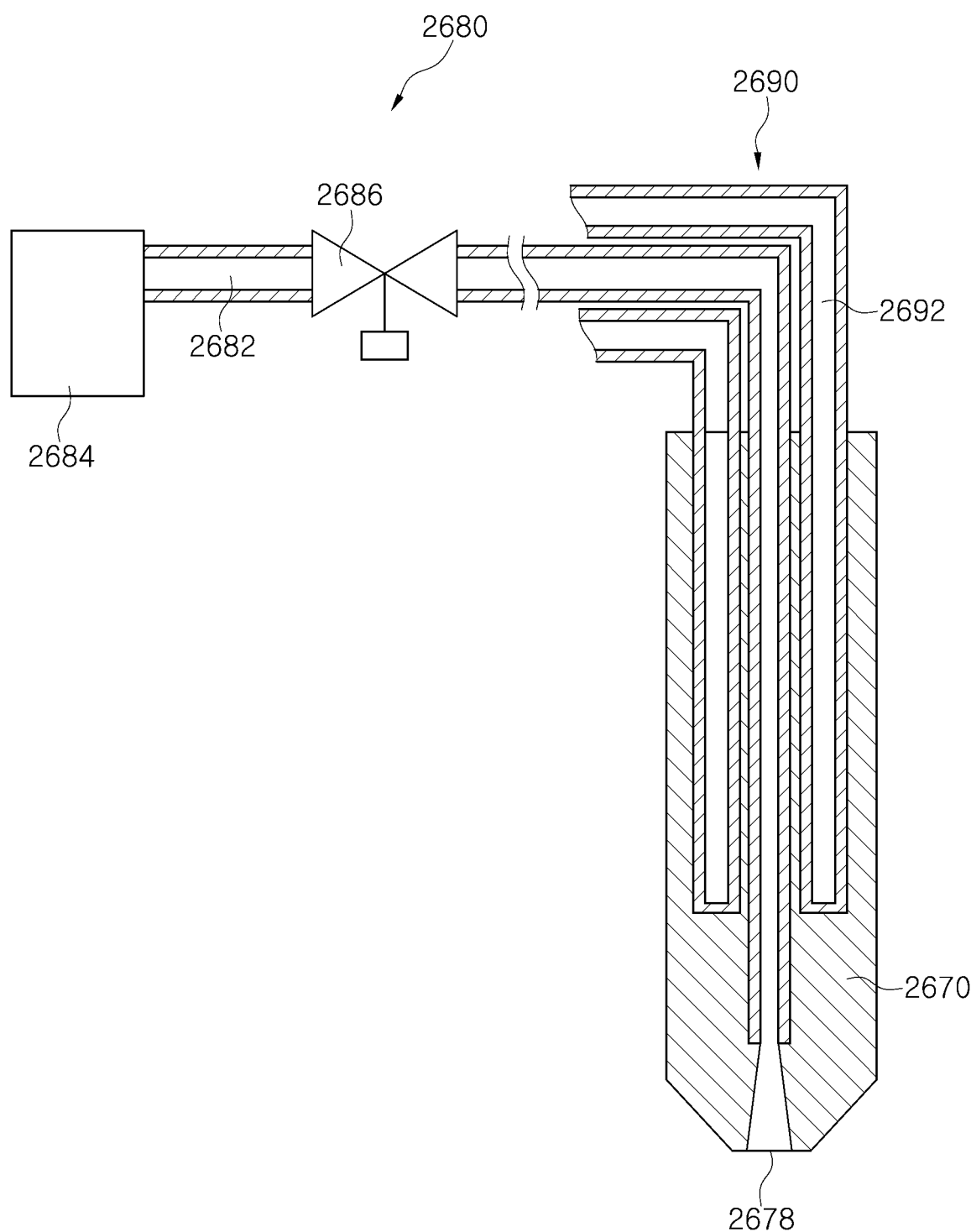
FIG. 4 is an enlarged sectional view schematically showing the structure of the processing liquid supply unit shown in FIG. 2.
Figure 5A:
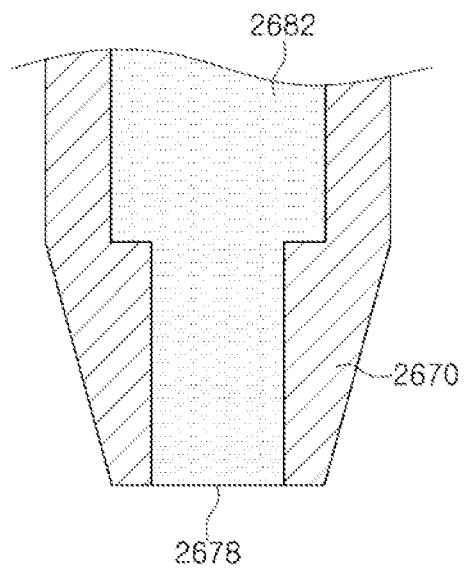
FIGS. 5A and 5B are enlarged sectional views schematically showing examples of a nozzle shown in FIG. 2.
Figure 5B:
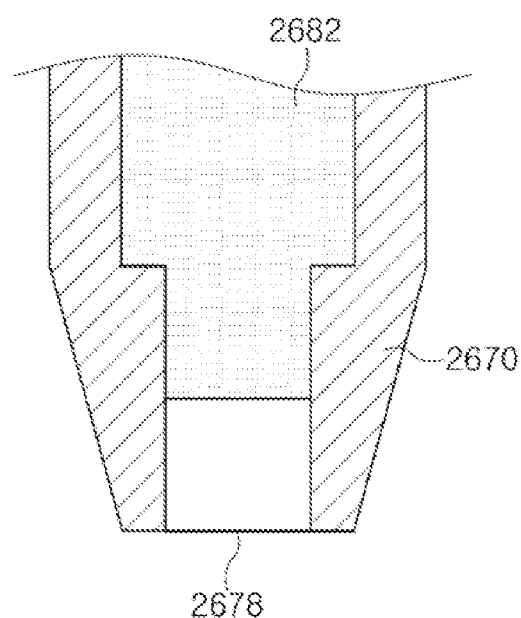

FIGS. 3 to 5B are views showing an example of the processing liquid supply unit according to the embodiment of the present disclosure. FIG. 3 is an enlarged view schematically showing a processing liquid supply unit shown in FIG. 2. FIG. 4 is an enlarged sectional view showing the processing liquid supply unit shown in FIG. 2. FIGS. 5A and 5B are side sectional views showing examples of the nozzle of the processing liquid supply unit shown in FIGS. 3 and 4.

According to the embodiment of the present disclosure, the processing liquid supply unit 2602 may include the nozzle 2670, a processing liquid supply portion 2680, and a cooler 2690.

According to the embodiment of the present disclosure, the nozzle 2670 discharging the processing liquid onto the substrate W may be a single nozzle. The nozzle 2670 includes a nozzle outlet 2678 through which the processing liquid is discharged. The nozzle 2670 may be provided above the inside of the processing space and supply the processing liquid to the substrate W. Specifically, the nozzle 2670 may discharge the processing liquid toward the upper surface of the substrate W. For example, the nozzle 2670 may discharge the processing liquid in a spray manner. The nozzle 2670 may be moved by the moving member 2671. The nozzle 2670 is connected to the processing liquid supply portion 2680 and thus may be supplied with the processing liquid from the processing liquid supply portion 2680.

The nozzle 2670 may supply an inert gas such as $N_2$ toward the upper surface of the substrate W. For example, the nozzle 2670 may supply the inert gas toward the substrate when the supply of the processing liquid toward the substrate is complete. Therefore, the nozzle 2670 may be connected to a gas supply part that is separately provided for supplying the inert gas. The nozzle 2670 may be connected to each of the processing liquid supply portion 2680 and the gas supply part through separate supply pipes.

Referring to FIGS. 3 and 4, the processing liquid supply portion 2680 may include a supply line 2682 and a processing liquid supply tank 2684 as a configuration to supply the processing liquid to the nozzle 2670.

The processing liquid supply tank 2684 may store the processing liquid and supply the stored processing liquid to the nozzle 2670. The processing liquid supply tank 2684 is connected to the nozzle 2670 via the supply line 2682. The processing liquid supplied from the processing liquid supply tank 2684 may be supplied to the nozzle 2670 along the supply line 2682. A first end of the supply line 2682 may be connected to the nozzle 2670 and a second end of the supply line 2682 may be connected to the processing liquid supply tank 2684. The supply line 2682 may be embedded in the moving member 2671. A valve 2686 may be provided on the supply line 2682 to adjust a supply flow rate of the processing liquid. The valve 2686 may allow the supply of the processing liquid to start or stop.

Because of the processing liquid supply unit provided above the substrate, even when the supply of the processing liquid stops, there may be the dropping of the processing liquid, in which the processing liquid remaining in the nozzle 2670 leaks to the substrate W by gravity. Particularly, when a diameter of the nozzle outlet is large or the processing liquid used in the substrate processing is a low surface tension fluid such as isopropyl alcohol (IPA), the dropping of the processing liquid may significantly increase. The substrate may be contaminated or damaged by the dropping of the processing liquid. Therefore, in order to prevent the damage to the substrate due to the dropping of the processing liquid, the present disclosure uses a method of sucking back the processing liquid by cooling the processing liquid and reducing the volume of the processing liquid.

The cooler 2690 may be arranged to cool a supply line 2682 that provides a moving route of the processing liquid as a configuration to cool the processing liquid. As the supply line 2682 is cooled, the processing liquid in the supply line 2682 may be cooled.

The cooler 2690 may cool the supply line 2682 by supplying coolant to the outside of the supply line 2682. The cooler 2690 may be provided at the entire supply line 2682. Alternately, the cooler 2690 may be provided at part of the supply line 2682.

The cooler 2690 may be provided at the outside of the supply line 2682. For example, the cooler 2690 may include a tubular member 2692 provided to surround the supply line 2682. As shown in FIG. 4, the tubular member 2692 surrounding the supply line 2682 may have an inside space. The cooler 2690 may supply and the coolant to the inside space of the tubular member 2692 so that the coolant flows, and thus cool the supply line 2682. As the supply line 2682 is cooled, the temperature of the processing liquid is reduced, and as the temperature of the processing liquid is reduced, the volume of the processing liquid may be reduced. As the volume of the processing liquid is reduced, the processing liquid may be sucked back.

For example, as shown in FIG. 5A, the processing liquid may remain in the inside space of the nozzle 2670 where the supply of the processing liquid stops. A location of the remaining processing liquid may coincide with a location of the nozzle outlet by gravity. However, when the processing liquid the supply line 2682 is cooled using the coolant as described above, the temperature of the processing liquid is reduced and the volume of the processing liquid is reduced. Therefore, the processing liquid may be sucked back from the nozzle outlet 2678. As shown in FIG. 5B, a location of the processing liquid remaining in the nozzle 2670 may be raised.

As described above, the cooler 2690 may supply the coolant to the tubular member 2692 to prevent the processing liquid from dropping from the nozzle 2670.

Although not shown in the drawings, the tubular member 2692 may be connected to a coolant supply part provided for supplying the coolant. The used coolant may be recovered to the coolant supply part and reused.

Meanwhile, the cooler 2690 may be supplied to control the temperature, supply flow rate, supply time, heat transfer area, etc. of the coolant. As the conditions of the coolant are controlled according to a type of the processing liquid, the volume or time of the processing liquid sucked back may be adjusted.

Furthermore, as described above, the processing liquid supply unit according to the embodiment of the present disclosure is configured such that the single nozzle 2670 discharges the processing liquid and the inert gas. Therefore, the nozzle 2670 may be driven for supplying the inert gas after the supply of the processing liquid stops. Therefore, the cooler 2690 supplies the coolant to the tubular member 2692 until the process of the substrate processing is complete, so that it is possible to prevent the dropping of the processing liquid from the nozzle 2670.

The cooler 2690 may supply the coolant to the tubular member 2692 during the entire process time of the liquid treatment process. A flow rate of the coolant supplied to the tubular member 2692 may be different for each section. For example, when the substrate processing process by the processing liquid is complete and the nozzle 2670 is not operated, the cooler 2690 may supply a relatively greater flow rate of the coolant to the tubular member 2692. At this point, the cooling is to suck back the processing liquid remaining in the nozzle 2670. On the other hand, when the nozzle 2670 performs the substrate processing by the inert gas, the cooler 2690 may supply a relatively lower flow rate of the coolant to the tubular member 2692 in order not to affect the inert gas discharge of the nozzle 2670. The above supply is to hold the processing liquid remaining in the nozzle 2670 from dropping to the substrate. Accordingly, even when the nozzle 2670 is driven for supplying the inert gas as well as is in a waiting state, the dropping of the processing liquid may be prevented.

Figure 6:
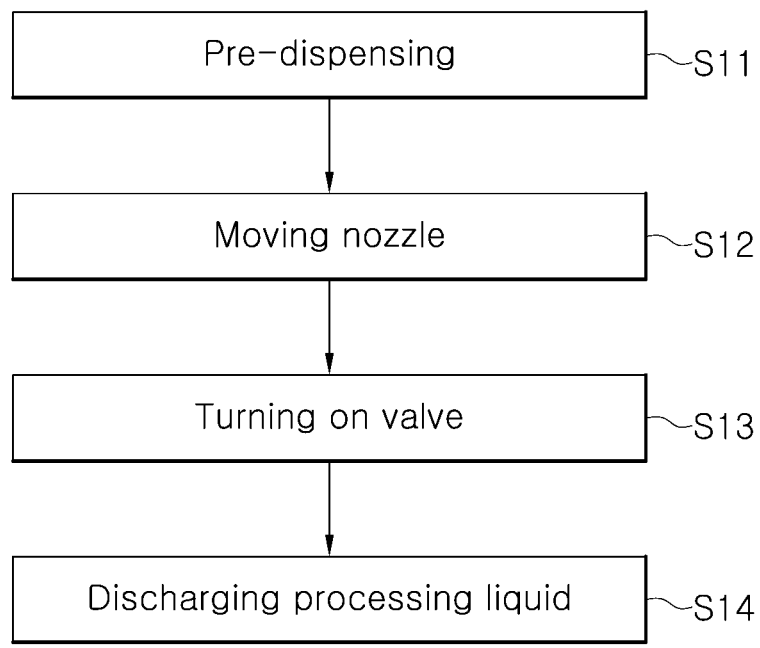
FIG. 6 is a flowchart showing part of a substrate processing method according to an embodiment of the present disclosure.
Figure 7:
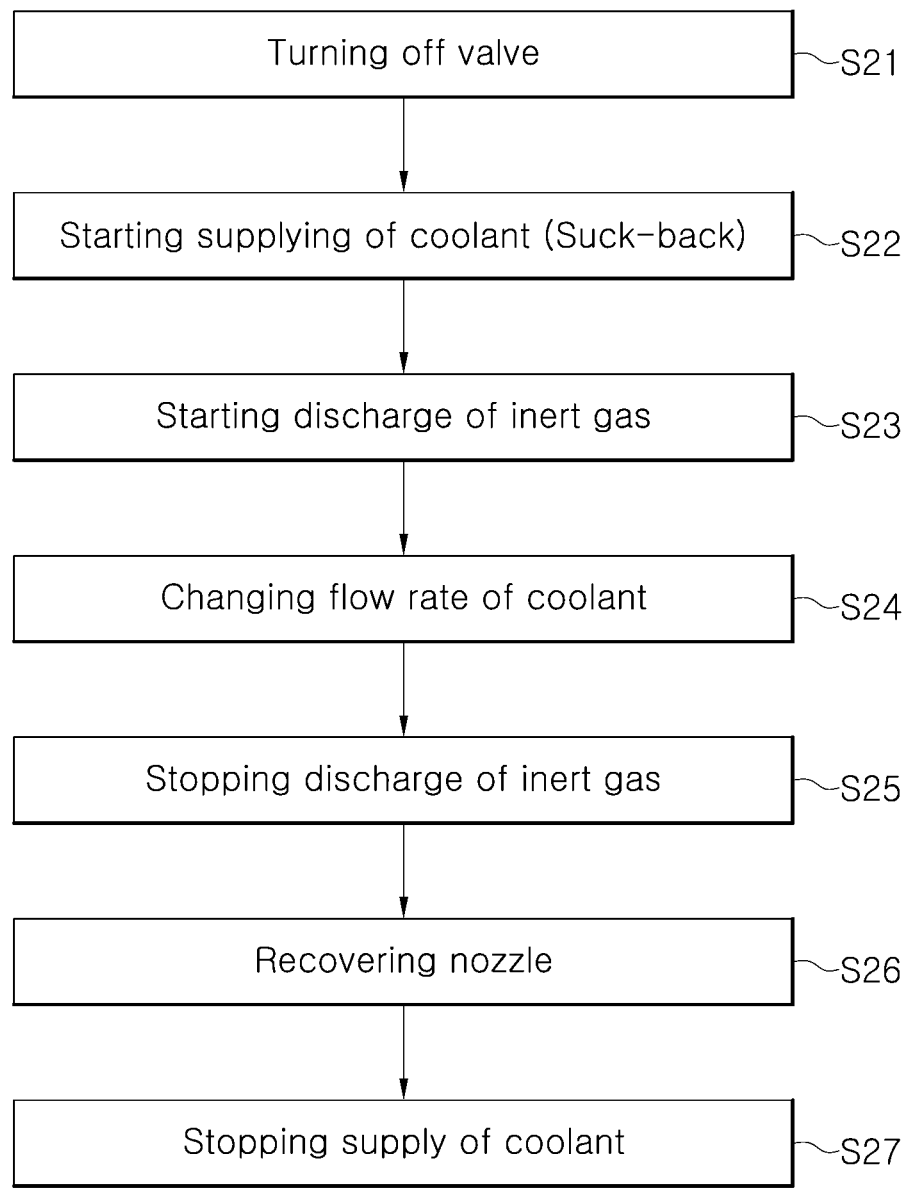
FIG. 7 is a flowchart showing part of the substrate processing method according to the embodiment of the present disclosure.

FIGS. 6 and 7 are flowcharts showing the substrate processing method according to the embodiment of the present disclosure. FIG. 6 is the flowchart schematically showing a pre-process of the substrate processing process according to the embodiment of the present disclosure. FIG. 7 is the flowchart schematically showing a post-process of the substrate processing process according to the embodiment of the present disclosure.

Hereinbelow, for convenience of description, the substrate processing method using the substrate processing apparatus according to the present disclosure as shown in FIGS. 3 to 5B will be described.

According to the embodiment of the present disclosure, the substrate processing method may include discharging the processing liquid at S10, sucking back the processing liquid, supplying the inert gas, and cooling the processing liquid.

The pre-process of the substrate processing process may include the supplying the processing liquid at S10. The post-process of the substrate processing process may include the sucking back the processing liquid, the supplying the inert gas, and the cooling the processing liquid.

The supplying the processing liquid at S10 may be performed by discharging the processing liquid onto the substrate. In the supplying the processing liquid at S10, the nozzle located above the substrate may supply the processing liquid to the substrate. As shown in FIG. 6, the supplying the processing liquid at S10 may include pre-dispensing at S11, moving the nozzle at S12, turning on the valve at S13, and discharging the processing liquid at S14.

The pre-dispensing at S11 is performed, before the liquid treatment process is performed and the nozzle 2670 is located on the waiting location, by discharging and removing non-steady processing liquid. The pre-dispensing at S11 is performed until all the non-steady processing liquid is discharged. The discharged non-steady processing liquid may be recovered by a recovery part that is separately provided at the waiting location. The pre-dispensed processing liquid may be discarded or recycled.

When the pre-dispensing at S11 is complete, the moving the nozzle is performed at S12, in which the nozzle 2670 is moved from the waiting location to the process location by the moving member 2671.

When the nozzle 2670 is moved to the process location, in order to perform the process, the turning on the valve 2686 at S13, in which the valve 2686 is turned on and to start the processing liquid supply, may be performed.

When the valve 2686 is turned on, the processing liquid is transferred from the processing liquid supply tank 2684 to the nozzle 2670 so that the processing liquid may be discharged onto the substrate at S14.

When a preset amount of the processing liquid is discharged at the discharging the processing liquid at S14, the processing liquid supply should stop.

The sucking back the processing liquid, the supplying the inert gas, and the cooling the processing liquid may be included in the post process of the substrate processing process. Particularly, the cooling the processing liquid may be continuously performed in the entire process of the post process of the substrate processing process.

Referring to FIG. 7, a process of stopping the processing liquid discharge may start from turning off the valve at S21. When the discharge of the processing liquid is complete, the valve 2686 is turned off to stop the processing liquid supply. By the turning off the valve at S21, the processing liquid supply from the processing liquid supply tank 2684 stops. However, the processing liquid may remain in the nozzle 2670. Therefore, when the turning off the valve at S21 is complete, the sucking back the processing liquid at S22 may be performed to prevent the processing liquid remaining in the nozzle 2670 from dropping to the substrate by gravity.

According to the embodiment of the present disclosure, the sucking back the processing liquid at S22 includes the cooling the processing liquid. The cooling the processing liquid may include the supplying the coolant to the outside of the supply line 2682 by the cooler 2690. Accordingly, the coolant supply may be turned on in the sucking back the processing liquid at S22.

In the cooling the processing liquid, the cooler 2690 supplies the coolant to the outside of the supply line 2682 to cool the supply line 2682 and the processing liquid and to reduce the volume of the processing liquid. The cooling the processing liquid included in the sucking back the processing liquid at S22 is provided for the sucking back (because the height of the processing liquid remaining in the nozzle is raised), a relatively greater flow rate of the coolant may be supplied to the cooler 2690.

After the supply of the processing liquid from the nozzle 2670 stops, the substrate dry process may start and the inert gas such as nitrogen may be discharged from the nozzle 2670 where the processing liquid is discharged. The inert gas such as nitrogen may be discharged to the upper surface of the substrate by the nozzle 2670 at S23. For example, the discharging the inert gas at S23 may be performed to promote the drying of the substrate.

The cooling the processing liquid may be continuously performed in the discharging the inert gas at S23. The cooling the processing liquid in the discharging the inert gas S23 is performed by cooling the processing liquid for holding the processing liquid in order to prevent the processing liquid remaining in the nozzle 2670 from dropping to the substrate and lowering the efficiency of the drying process when the inert gas is supplied from the nozzle 2670 (because change of a location of the processing liquid in the nozzle is not necessary). In addition, since the cooling the processing liquid should not affect the discharging of the inert gas, it is preferable that a relatively lower flow rate of the coolant is supplied to the cooler 2690 in comparison to the sucking back the processing liquid S22. Preferably, a flow rate of the coolant supplied in the sucking back the processing liquid and the flow rate of the coolant supplied in the supplying the inert gas are different from each other.

Accordingly, after the discharging the inert gas starts at S23, changing a flow rate of the coolant may be performed at S24.

As described above, the cooling the processing liquid may be continuously performed throughout the entire post process of the substrate processing process. The volume of the processing liquid is reduced by the cooling the processing liquid, so that it is possible to prevent the processing liquid from dropping from the nozzle 2670. In the cooling the processing liquid, conditions of the coolant, such as the temperature, flow rate, supply time, heat transfer area, etc. of the coolant may be controlled. Accordingly, the sucked-back volume of the processing liquid or the sucked-back time of the processing liquid may be controlled.

When the drying process of the substrate is complete, the discharging the inert gas may be complete at S25.

Accordingly, the substrate processing process is complete, and the nozzle 2670 is recovered to the waiting location by the moving member 2671 at S26. The nozzle 2670 recovered to the waiting location is no longer located above the substrate, and the sucking back the processing liquid does not need to be performed, whereby the supplying the coolant stops and the cooling the processing liquid may stop at S27.

As described above, according to the embodiments of the present disclosure, as the processing liquid supply unit, and the substrate processing apparatus and method including the processing liquid supply unit may cool the processing liquid using the coolant to reduce the volume of the processing liquid, the processing liquid may be sucked back. In addition, the conditions of the coolant may be controlled to control the sucking back process, whereby the dropping of the processing liquid, the Taylor cone, the air layer at an end of the nozzle, etc. may be prevented.

Although the liquid treatment process has been described with the cleaning process as an example, the liquid treatment process according to the embodiment of the present disclosure may be applied to the process in which the substrate is processed using the processing liquid, such as a coating process, developing process, etching process, asking process, etc. Since the present disclosure may be embodied in other specific forms without changing the technical sprit or essential features, those skilled in the art to which the present disclosure belongs should understand that the embodiments described above are exemplary and not intended to limit the present disclosure.

The scope of the present disclosure will be defined by the accompanying claims rather than by the detailed description, and those skilled in the art should understand that various modifications, additions, and substitutions derived from the meaning and scope of the present disclosure and the equivalent concept thereof are included in the scope of the present disclosure.

What is claimed is:

1. A substrate processing method using a substrate processing apparatus, the apparatus comprising a nozzle configured to discharge a processing liquid or inert gas onto an upper surface of a substrate and a supply line provided for supplying the processing liquid to the nozzle, the substrate processing method comprising:

discharging the processing liquid onto the upper surface of the substrate;

sucking the processing liquid remaining in the nozzle during a time when the discharging of the processing liquid onto the upper surface of the substrate is stopped; and supplying the inert gas onto the upper surface of the substrate, wherein each of the sucking of the processing liquid and the supplying of the inert gas onto the upper surface of the substrate comprises cooling the processing liquid, wherein the cooling the processing liquid comprises supplying coolant to an outside of the supply line, and wherein a flow rate of the coolant supplied in the sucking of the processing liquid and a flow rate of the coolant supplied in the supplying the inert gas are different from each other.

2. The substrate processing method of claim 1,
   wherein the cooling of the processing liquid reduces a volume of the processing liquid.

3. The substrate processing method of claim 2,
   wherein the cooling the processing liquid in the supplying of the inert gas prevents the processing liquid from dropping onto the upper surface of the substrate from the nozzle.

4. The substrate processing method of claim 1, wherein in the cooling of the processing liquid, at least one of a temperature, a flow rate, a supply time, a heat transfer area of the coolant is controlled.

5. The substrate processing method of claim 4, wherein the coolant is controlled such that a volume of the processing liquid sucked or a time for which the processing liquid is being sucked is controlled.

* * * * *